United States Patent [19]

Golubic

[11] Patent Number: 4,832,784
[45] Date of Patent: May 23, 1989

[54] POSITIVE STOP, PICK UP TOOL
[75] Inventor: Theodore R. Golubic, Phoenix, Ariz.
[73] Assignee: Motorola Inc., Schaumburg, Ill.
[21] Appl. No.: 869,492
[22] Filed: Jun. 2, 1986
[51] Int. Cl.⁴ .................... B23P 19/04; B32B 35/00
[52] U.S. Cl. ................................. 156/497; 156/556; 156/562; 29/743
[58] Field of Search ............... 156/556, 560, 562, 423, 156/497; 29/740, 741, 743

[56] References Cited
U.S. PATENT DOCUMENTS 3,834,966  9/1974  Kelly ................................. 156/560
3,855,034 12/1974  Miller ............................... 156/556
4,292,116  9/1981  Takahashi ......................... 156/566
4,507,861  4/1985  Sprenkle ............................ 29/741

Primary Examiner—Michael W. Ball
Assistant Examiner—J. Davis
Attorney, Agent, or Firm—Joe E. Barbee; Raymond J. Warren

[57] ABSTRACT

The present invention consists of a positive stop, pick up tool for use in precisely placing a die and leaving the required die attach material thickness between the die and the package substrate. The tool comprises: a body; a pad attached to the body for picking up dice; and positive stop pins attached to the body and extending a distance from the body equal to the distance the pad extends from the body plus the thickness of the die plus the required thickness of the die attach material.

12 Claims, 3 Drawing Sheets

POSITIVE STOP, PICK UP TOOL

BACKGROUND OF THE INVENTION

This invention relates, in general, to pick up tools, and, more particularly, to positive stop, pick up tools for the accurate placement of integrated circuit (IC) dice on a packaging substrate.

This type of tool is designed for use in placing an IC die on a die attach material disposed on the surface of the packaging substrate. Presently, a resistance sensing pick up is utilized that measures the amount of resistive force bond being exerted on the die from the die attach material. Various problems result from this type of IC die placement.

One of the problems results from environmental changes or varying die attach material mixtures. These types of changes can cause the viscosity of the die attach material to vary which will cause the amount of resistance, encountered by the pick up when placing the die on the substrate, to vary. This causes the die to be placed at different heights above the substrate causing different thicknesses of die attach material (epoxy) to be left between the substrate and the die.

By way of example, one particular die attach material, silver glass paste, requires that, when cured, a minimum height of 0.002 inches of dry die attach material or the die attach material will not reliably hold the die to the substrate. In order to have 0.002 inches of die attach material dry, a wet die attach material thickness of 0.004 inches must be maintained. If the viscosity of the die attach material is reduced from the normal, due to environmental changes or die attach material composition, the resistance encountered by the pick up will be reduced causing the die to be placed closer to the substrate. This then causes the thickness of the die attach material to be less than required.

In addition, problems can be caused by the allowable tolerances in the thickness of the packaging substrate. In adding up the tolerances of the various layers of the substrate it is not unusual for a total thickness tolerance of ±0.004 inches to be present. Using the type of die attach material agent referred to above, requiring a thickness of 0.004 inches wet, this tolerance can result in the reduction of the thickness of the die attach material to a level below the required minimum.

A further problem results from substrates that do not have level surfaces across the plane where the die is to be attached. Since the present pick up tools only measure the overall resistance exerted by the die attach material, if one corner of the substrate area is higher, due to allowable package fabrication processing tolerances, than the other three corners, then the corresponding die corner will be closer to the substrate than the remaining three corners. This causes a die attach material thickness of less than 0.002 inches for a portion of the die attach material which will not provide the required bonding.

SUMMARY OF THE INVENTION

Accordingly, it is an object of the present invention to provide a positive stop, pick up tool that will overcome the above deficiencies.

A further object of the present invention is to provide a positive stop, pick up tool that is not dependent upon the viscosity of a die attach material.

Another object of the present invention is to provide a positive stop, pick up tool that will not be affected by changes in thickness of the packaging substrate.

Still another object of the present invention is to provide a positive stop, pick up tool that can compensate for variations in surface heights of the substrate.

Yet another object of the present invention is to provide a positive stop, pick up tool that will provide a predetermined, repeatable, residual thickness of die attach material between the die and the package substrate.

A further object of the present invention is to provide a positive stop, pick up tool that will result in reduced part rejections due to insufficient paste thickness.

Still another object of the present invention is to provide a positive stop, pickup tool that is adjustable in three dimensions.

The above and other objects and advantages of the present invention are provided by the positive stop, pick up tool described herein.

A particular embodiment of the present invention consists of a positive stop, pick up tool having: a body; a pad attached to the body for picking up dice; and positive stop pins attached to the body and extending a distance from the body equal to the distance the pad extends from the body plus the thickness of the die plus the required thickness of the die attach material.

DETAILED DESCRIPTION OF THE DRAWINGS

Figure 1A:
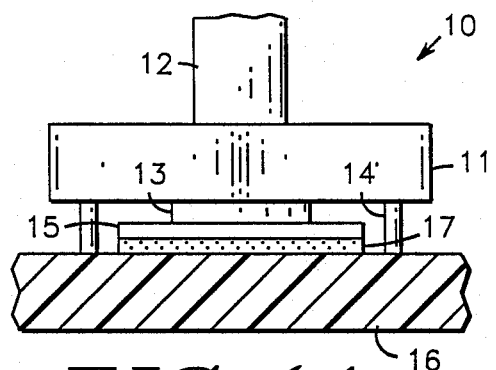
FIGS. 1A-1C are partial side views of a positive stop, pick up tool embodying the present invention.
Figure 1B:
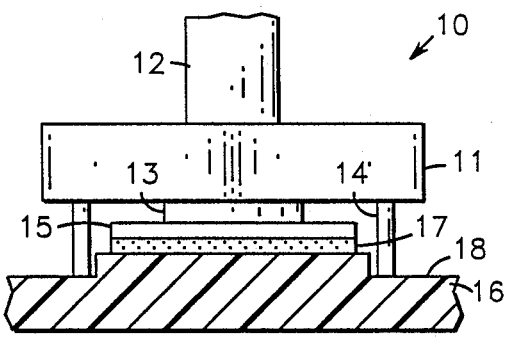
Figure 1C:
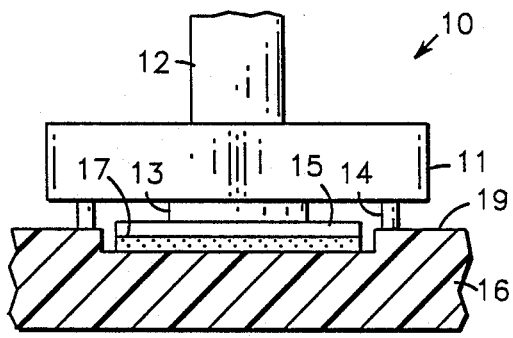

Referring to FIGS. 1A-1C, a partial side view of a positive stop, pick up tool, generally designated 10, is illustrated. Tool 10 consists of a body 11, a shaft 12, a pick up pad 13 and a pin 14. In one specific embodiment: body 11 is comprised of aluminum; shaft 12 and pin 14 are comprised of stainless steel; and pad 13 is comprised of Nylatron, a mark of Polymer Corporation.

As shown in Figs.1A-1C, Tool 10 holds a die 15 by suction through shaft 12 and pad 13. Pin 14 is shown extending below die 15 by a predetermined distance. The extension of pin 14 below die 15 is set according to the type of die attach material used to secure die 15. Tool 10 will place die 15 on a substrate 16 having a layer of die attach material 17 disposed thereon. Pin 14 insures that die 15 will be positioned the appropriate distance above substrate 16 so that the required thickness of die attach material 17 is maintained. Once die 15 is in place, tool 10 releases the die by removing the suction

FIG. 1A shows die 15 being placed on package substrate 16 having a relatively level surface. FIG. 1B shows die 15 being placed on substrate 16 having a depression 18. To accommodate this pin 14 has been extended the height of depression 18. In FIG. 1C, die 15 is shown being placed on substrate 16 having a step 19. For this, pin 14 is shortened a length equal to step 19.

As shown, Tool 10 would not be affected by: changes in substrate thicknesses due to allowable tolerances; or different viscosities of die attach material, since the height of pin 14 is not dependent upon these factors.

Figure 2:
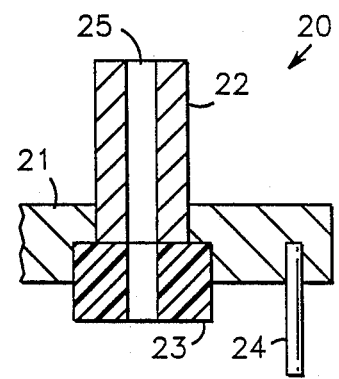
FIG. 2 is a cross-sectional view of a positive stop, pick up tool embodying the present invention.

Referring now to FIG. 2, a cross-sectional view of a positive stop, pick up tool, generally designated 20 is illustrated. Tool 20 consists of a body 21, a shaft 22, a pick up pad 23 and a pin 24. Shown here shaft 22, pad 23 and pin 24 are all press fitted into body 21. Shaft 22 and pad 23 define an opening 25 disposed therethrough. Opening 25 is provided for the suction that picks up and holds the die until it is in place.

Figure 3:
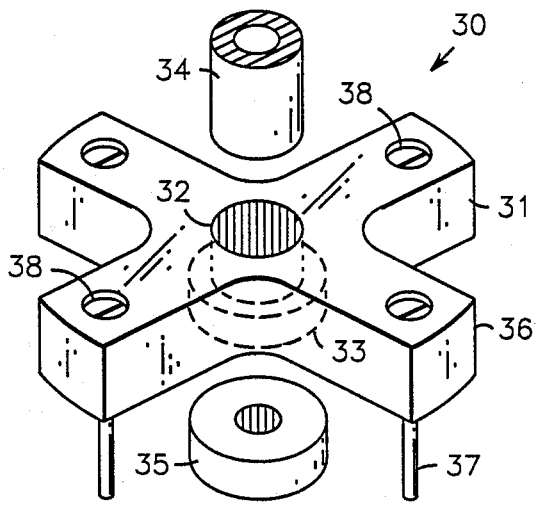
FIG. 3 is a view, in perspective, of a positive stop, pick up tool embodying the present invention.

Referring now to FIG. 3, a view in perspective of a positive stop, pick up tool, generally designated 30, is illustrated. Tool 30 consists of a body 31 having two connecting openings disposed therethrough: a shaft opening 32 and a pick up pad opening 33. A shaft 34 is inserted into opening 32 of body 31. A pick up pad 35 is inserted into opening 33 of body 31.

Body 31 is shown having four arms 36 disposed about the center of body 31 in an axial relation. Each arm 36 contains an adjustable pin 37 having a screw type head 38. While tool 30 would operate with as few as one arm 36, by providing tool 30 with four arms, each having a pin 37, the problem of a sloping surface on the substrate is overcome. With four pins 37, one of pins 37 will contact the high side of the sloping surface. This will insure that the minimum required thickness of the die attach material will be maintained throughout the die surface.

Figure 4:
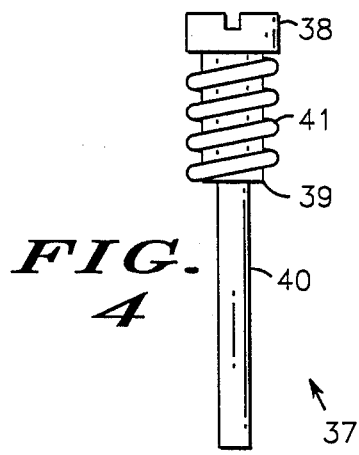
FIG. 4 is a side view of the adjustable pin utilized by the positive stop, pick up tool of FIG. 3.

A more detailed view of adjustable pin 37 of FIG. 3 is shown in FIG. 4. Pin 37 is shown having screw head 38, a screw body 39, and a pin body 40. Pin body 40 is press fitted into screw body 39. An optional compression spring 41 is shown disposed below screw head 38 and about screw body 39. Spring 41 provides tension to enable a more accurate adjustment of the extension of pin 37 and to inhibit movement of pin 37 during use.

Figure 5:
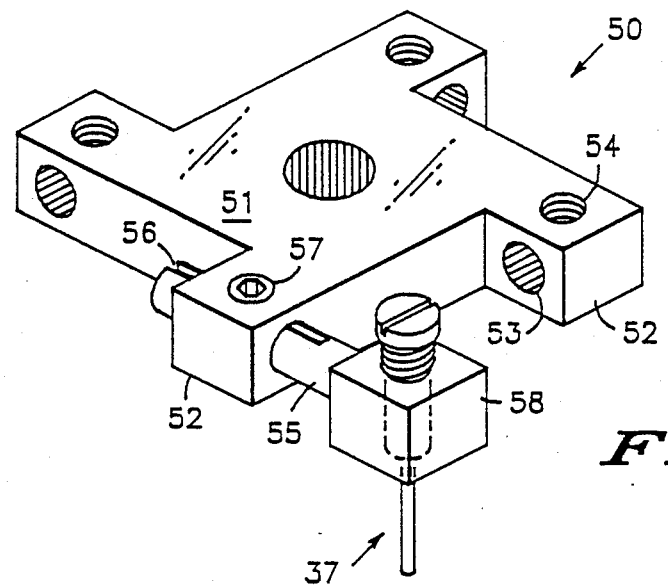
FIG. 5 is a view in perspective of an adjustable positive stop, pick up tool embodying the present invention.

Referring now to the diagram of FIG. 5, a view in perspective of an adjustable positive stop, pick up tool, generally designated so, embodying the present invention is illustrated. Tool 50 is shown having a body 51 and four arms 52. Each arm 52 is shown with a set of holes, 53 and 54.

Hole 53 is designed to receive an adjustably extending member 55 having a groove 56 extending along the width of member 55. A set screw 57, or the like is shown disposed in hole 54 for securing member in place.

Attached to one end of member 55 is a housing 58. Housing 58 is designed to house pin 37, FIG. 4. Tool 50 is representable of a device that is adjustable in three directions, pin 37 can adjust the Z direction; member 55 can be adjusted in the X; and a second member 55, not shown, disposed in hole 53 in the Y directions. It should be noted that if only one adjustable member 55 is utilized, entire body 51 can be rotated and used in conjunction with member 55 to achieve movement in the X and Y directions.

This type of positive stop, pick up tool, that is adjustable in three directions (X, Y and Z), provides a single tool that is used for a variety of die sizes. It should be noted here that, while tool 50 has been shown with a set screw 57, there are a variety of apparatus that could be used in an adjustable arm (e.g. hydraulics).

Figure 7:
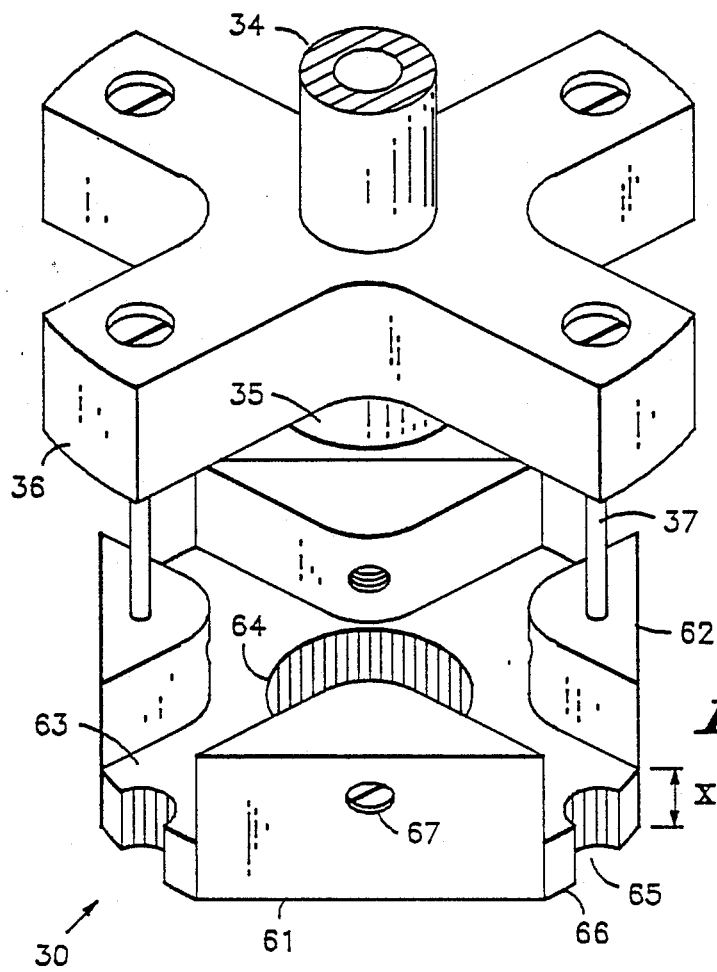
FIG. 7 is a perspective view of the positive stop, pick up tool of FIG. 3 shown in combination with the set up device of FIG. 6.
Figure 6:
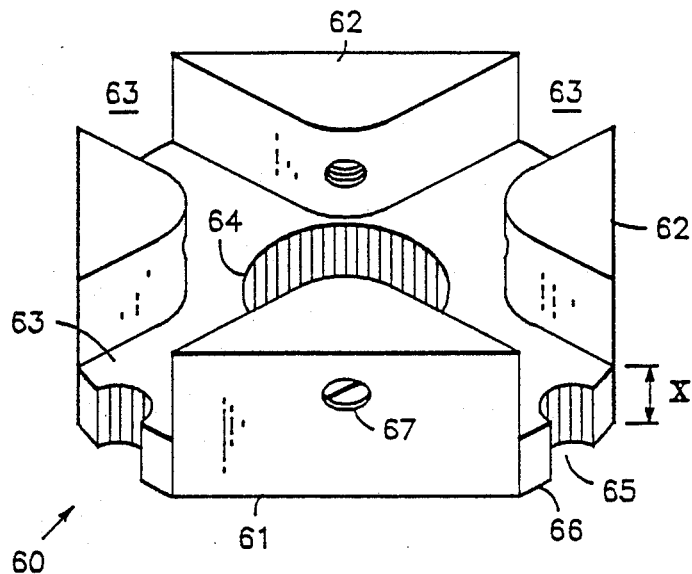
FIG. 6 is a view, in perspective, of a set up device for a positive stop, pick up tool embodying the present invention.

In FIG. 6, a perspective view of a set up device, generally designated 60, is illustrated. Device 60 consists of a body 61 having four plateaus 62. Plateaus 62 define four grooves 63 extending in an axial relation from the center to the corners of body 61. As shown in FIG. 7, grooves 63 correspond to arms 36 of body 31, FIG. 3. Body 61 has an opening 64 disposed at its center to receive pad 35. The corners of device 60 have pin grooves 65 that are shaped to accommodate pins 37. A height "X" of a base portion 66 of body 61 is designed to be the required height of the die attach material plus the heights of the die and pad, see FIG. 1.

In operation, positive stop, pick up tool 30 would be disposed in a mating relation with set up device 60. An optional set screw 67 may be used to hold tool 30 in place during adjustment. Device 60 is then placed on a level surface and pins 37 are lowered until they are in contact with the level surface, giving pins 37 a length equal to "X". This type of set up device provides a consistent and more accurate set up of positive stop, pick up tool 30.

Figure 8:
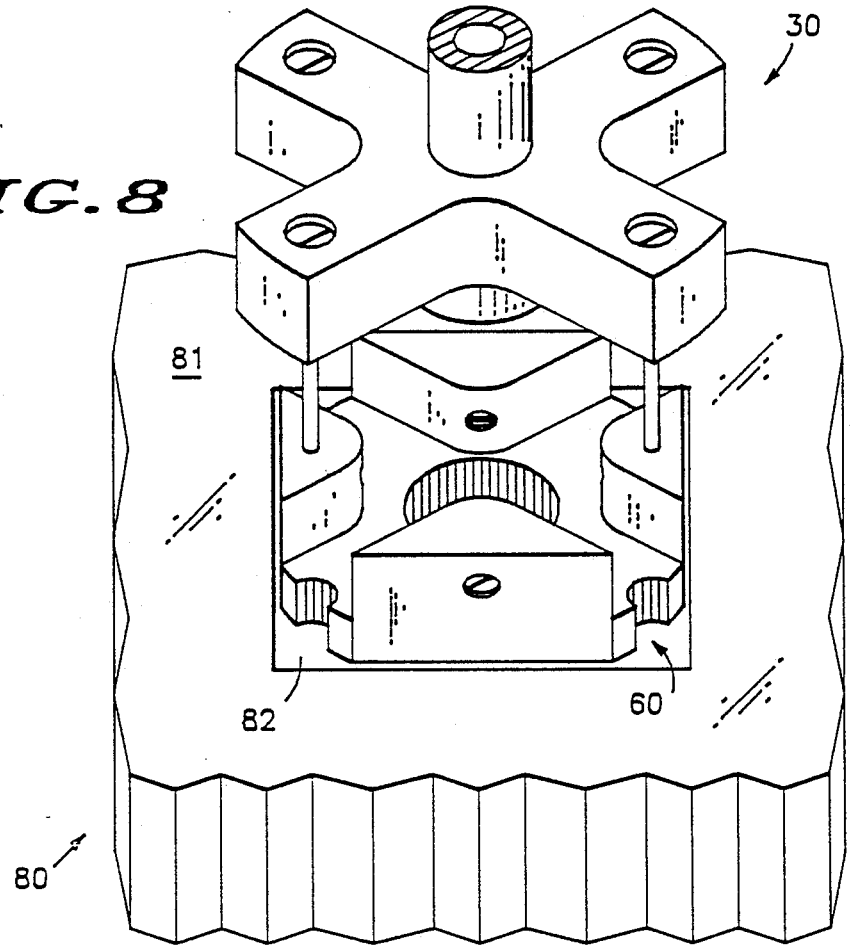
FIG. 8 is a view in perspective of the pick up tool and set up device of FIG. 7.

Referring now to FIG. 8, a view in perspective of pick up tool 30, FIG. 3, and set up device 70, FIG. 6, are illustrated, in conjunction with a package 80. Package 80 has a surface 81 with a die area 82 being defined therein. Set up device 60 is shown disposed in area 82 where a dice is to be placed.

This is used in die bonding devices such as described in U.S. Pat. No. 3,720,309 entitled "Method and Apparatus for Sorting Semiconductor Dice". In this the die bonder, not shown, operates pick up device 30 by moving it to a line containing the dice; picking up the dice; and placing the dice in the package in opening 82. In order to perform this function accurately, the die bonder must be instructed as to the location of opening 82. This can be done either by placing set up device 60 in opening 82 and then placing pick up device 30 over set up tool 60 or by coupling set up device 30 to pick up tool 60 and then placing set up device 30 in opening 82. Once pick up tool 30 is in place the die bonder can, with the aid of a computer, read and remember the location. Set up device 60 is then removed and pick up tool 30 can be controlled by the die bonder to pick up a die and place it in the appropriate place.

To facilitate the set up process, the step of setting the pin heights can be combined with the step of delineating the location of the die on the package.

Thus it is apparent to one skilled in the art that there has been provided in accordance with the invention, a device and method that fully satisfies the objects, aims and advantages set forth above.

While the invention has been described in conjunction with specific embodiments thereof, it is evident that many alterations, modifications, and variations will be apparent to those skilled in the art in light of the foregoing description. Accordingly, it is intended to embrace all such alterations, modifications and variations in the appended claims.

I claim:

1. A positive stop, pick up tool comprising:
a body having first and second surfaces;
a shaft being coupled to said first surface of said body;

a pad being coupled to said second surface of said body opposite said shaft;

an adjustable positive stop means for indicating a die placement, said positive stop means being coupled to said second surface of said body, being juxtaposed to said pad, and being adjustable in an X, Y, and Z directions; and an arm having a first end coupled to said body and a second end being coupled to said positive stop means, wherein said arm comprises:

a first portion having a first end and a second end, said second end being coupled to said positive stop means; and a second portion having a first end coupled to said body and a second end for adjustably receiving said first end of said first portion.

2. The positive stop, pick up tool of claim 1 wherein said arm further comprises a securing means for securing said first portion to said second portion.

3. A positive stop, pick up tool comprising:

a body having first and second surfaces and an opening being disposed through said body from said first surface to said second surface;

a shaft having a first end, a second end opposite said first end, and an opening being disposed through said shaft from said first end to said second end, said second end of said shaft being disposed in a first portion of said opening of said body;

a pad having a first end, a second end opposite said first end, and an opening being disposed through said pad from said first end to said second end, said first end of said pad being disposed in a second portion of said opening of said body;

an adjustable positive stop means for indicating a die placement, said positive stop means being coupled to said body, being juxtaposed to said pad, and being adjustable in a vertical and radial directions from said body; and an arm coupled between said body and said positive stop means, said arm having an adjustable member having an end being coupled to said positive stop means, and said adjustable member being adjustably disposed in said body.

4. The positive stop, pick up tool of claim 3 wherein said positive stop means comprises a pin.

5. The positive stop, pick up tool of claim 4 where said pin extends a distance from said second surface of said body, said distance being equal to a distance said pad extends from said second surface of said body plus a thickness of said die plus a thickness of a die attach material.

6. The positive stop, pick up tool of claim 4 wherein said pin comprises:

a pin body having a first end; and a threaded portion being coupled to said first end of said pin body and adjustably disposed in said body of said positive stop, pick up tool to vary the extension of said pin body from said second surface of said body of said positive stop, pick up tool.

7. The positive stop, pick up tool of claim 3 further comprising a set up means conformed in a mating relation to said positive stop, pick up tool and having a base, said base having a thickness equal to a thickness of said die plus a thickness of a die attach material.

8. The positive stop, pick up tool of claim 3 wherein said positive stop means comprises a plurality of pins being coupled to said second surface of said body.

9. A positive stop, pick up tool comprising:

a body having first and second surfaces and an opening being disposed through said body from said first surface to said second surface;

a shaft having a first end, a second end opposite said first end, and an opening being disposed through said shaft from said first end to said second end, said second end of said shaft being disposed in a first portion of said opening of said body;

a pad having a first end, a second end opposite said first end, and an opening being disposed through said pad from said first end to said second end, said first end of said pad being dissposed in a second portion of said opening of said body;

a pin being coupled to said second surface of said body and being juxtaposed to said pad, said pin extends a distance from said second surface of said body, said distance being equal to a distance said pad extends from said second surface of said body plus a thickness of said die plus a thickness of a die attach material; and an adjustable arm having a first end adjustably coupled to said body and a second end being adjustably coupled to said pin.

10. The positive stop, pick up tool of claim 9 wherein said pin comprises:

a pin body having a first end; and a threaded portion being coupled to said first end of said pin body and adjustably disposed in said adjustable arm of said positive stop, pick up tool to vary the extension of said pin body from said second surface of said body of said positive stop, pick up tool.

11. The positive stop, pick up tool of claim 9 wherein said adjustable arm comprises:

a first portion having a first end and a second end, said second end being coupled to said pin; and a second portion having a first end coupled to said body and a second end for adjustably receiving said first end of said first portion.

12. The positive stop, pick up tool of claim 11 wherein said adjustable arm further comprises a securing means for securing said first portion to said second portion.

* * * * *